United States Patent [19]

Eichhorn et al.

[11] Patent Number: 5,700,621
[45] Date of Patent: Dec. 23, 1997

[54] POLYMERS AND PHOTOSENSITIVE MIXTURE PREPARED THEREWITH

[75] Inventors: Mathias Eichhorn, Niedernhausen; Andreas Elsaesser, Idstein, both of Germany

[73] Assignee: Agfa-Gevaert AG, Leverkusen, Germany

[21] Appl. No.: 607,809

[22] Filed: Feb. 28, 1996

[30] Foreign Application Priority Data

Mar. 4, 1995 [DE] Germany ............... 195 07 618.4

[51] Int. Cl.⁶ .................. G03C 1/52; C08F 20/54
[52] U.S. Cl. .................. 430/192; 430/165; 526/306
[58] Field of Search .............. 526/306; 430/192, 430/165

[56] References Cited

U.S. PATENT DOCUMENTS

| | | | |
|---|---|---|---|
| 2,529,455 | 11/1950 | Mowry | 260/326 |
| 3,515,552 | 6/1970 | Smith | 96/35.1 |
| 3,869,292 | 3/1975 | Peters | 96/115 R |
| 4,139,384 | 2/1979 | Iwasaki et al. | 96/33 |
| 4,189,323 | 2/1980 | Buhr | 430/281 |
| 4,551,409 | 11/1985 | Gulla et al. | 430/192 |
| 4,678,737 | 7/1987 | Schneller et al. | 430/270 |
| 4,699,867 | 10/1987 | Schneller et al. | 430/192 |
| 5,068,163 | 11/1991 | Elsaesser et al. | 430/192 |
| 5,275,908 | 1/1994 | Elsaesser et al. | 430/165 |

FOREIGN PATENT DOCUMENTS

| | | | |
|---|---|---|---|
| 0 187 517 | 7/1986 | European Pat. Off. | |
| 0 212 439 | 3/1987 | European Pat. Off. | |
| 0 212 440 | 3/1987 | European Pat. Off. | |
| 0 330 239 | 8/1989 | European Pat. Off. | |
| 0 544 264 | 6/1993 | European Pat. Off. | |
| 1217070 | 5/1966 | Germany | 526/308 |
| 3 742 387 | 6/1988 | Germany. | |
| 52-28401 | 7/1977 | Japan. | |
| 52-41052 | 10/1977 | Japan. | |

OTHER PUBLICATIONS

K. Kurita et al., "Addition of N-(Hydroxymethyl)phythalimide to Methacrylates by Carbon-Carbon Bond Formation", Bull. Chem. Soc. Jpn., vol. 61, (Oct. 1988), pp. 3755–3757.

K. Aoshima, "Negative-Working Photosensitive Compositions", Chemical Abstracts, JP-A-01 284 849, Band 112, No. 24, 11, (Jun. 1990).

M. Imai, "Photosensitive Compositions", Chemical Abstracts, JP-A-02 189 547, Band 114, No. 2, 14, (Jan. 1991).

Document No. 96:69552 "Ritter's reaction of polyacrylonitrile"; Janout et al, Makromol Chem 182(11), 2989–95 (English) 1981 pp. 19 and 20.

*Primary Examiner*—Joseph L. Schofer
*Assistant Examiner*—N. Sarofim
*Attorney, Agent, or Firm*—Foley & Lardner

[57] ABSTRACT

A polymer comprising repeating units of the formula

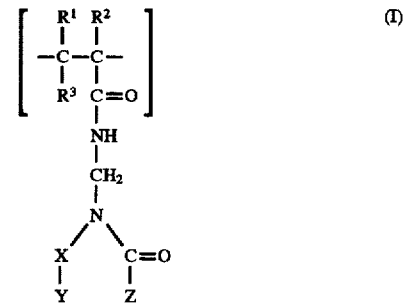

wherein
$R^1$, $R^2$ and $R^3$ are, independently of one another, hydrogen atoms or alkyl groups,
X is CO or $SO_2$, and
Y and Z are, independently of one another, alkyl, alkenyl, cycloalkyl, aryl or heterocyclic radicals, or Y and Z are linked to one another and are constituents of a five-membered or six-membered hetero-cyclic ring.

16 Claims, No Drawings

POLYMERS AND PHOTOSENSITIVE MIXTURE PREPARED THEREWITH

BACKGROUND OF THE INVENTION

1. Field of the Invention

The present invention relates to polymers which are suitable, inter alia, as binders for photosensitive mixtures based on 1,2-quinone diazides. The mixtures may be used, in particular, to produce planographic printing plates which can be processed directly to produce positive printing plates and by reversal development to produce negative printing plates.

2. Description of Related Art

Photosensitive mixtures which become soluble in developers, in particular aqueous alkaline solutions, as a result of exposure to light are generally known.

A substantial part of the properties of the resultant recording materials obtained by employing these photosensitive mixtures are determined, at least in part, by the quantitative main constituent of the radiation-sensitive or photosensitive mixture, which is the binder. Phenol-formaldehyde or cresol-formaldehyde condensation products of the novolak type are used almost exclusively as the binder for positive copying materials.

The length of the print run and the resistance of the photosensitive layers to washing and cleaning agents which are used in the printshop may affect the properties of the final printed product. Accordingly, for some applications of positive printing plates, the properties resulting from the use of novolak resins are less than optimum. In particular, in the case of printing processes which employ printing inks that cure in UV light, washing-out agents which damage novolak resins are routinely used. These washing-out agents generally have a high content of solvents such as ethers, esters or ketones or are composed solely of such solvents. The use of such solvents may likely result in considerable damage to copying layers which contain novolaks.

Thus, in the case of layers having novolaks as binders, it becomes necessary to perform a thermal hardening of the copying layers at temperatures above 200° C. before printing. Similarly, a thermal hardening may be necessary when run outputs of more than about 100,000 impressions are being conducted.

Various binders having improved properties have been proposed. Phenol resins based on naphthol are described in U.S. Pat. No. 4,551,409 as alkali-soluble binders for positive copying materials. Homopolymers and copolymers of vinyl phenols are disclosed in DE-A 23 22 230, U.S. Pat. No. 3,869,292, DE-A 34 06 927, and U.S. Pat. No. 4,678,737. Polymers of esters of acrylic acids with phenols are described in JP-A 76/36 129, EP-A 0 212 440 and EP-A 0 212 439. Copolymers of N-hydroxyphenylmaleimide are disclosed in EP-A 0 187 517. Mention has furthermore been made of homopolymers and copolymers of hydroxybenzylacrylamides in DE-A 38 20 699 and U.S. Pat. No. 5,068,163. Additionally, homopolymers and copolymers of hydroxybenzylacrylates are disclosed in DE-A 40 02 397 and U.S. Pat. No. 5,275,908. Homopolymers and copolymers of hydroxyphenylacrylamides are described in JP-A 75/55 406 and JP-B 77/28 401. Copolymers containing halomethyl units are discussed in EP-A 0 440 086. In addition, homopolymers and copolymers containing NH acid units are described in DE-A 37 42 387, EP-A 0 330 239 and EP-A 0 544 264.

With the exception of the polymers mentioned containing hydroxyphenylacrylamides or NH acid units, none of the proposed novolak alternatives has hitherto found a practical application. The reasons for this lack of practical application are, inter alia, these alternative monomers tend to exhibit poorer development behavior, higher developer consumption, impairment of exposure contrast and generally poor synthetic accessibility. Of the two binder types which have found practical application, polymers containing hydroxyphenyl-acrylamides are generally unsatisfactory in resistance to cleaning agents containing solvents, while polymers containing NH acid units are not sufficiently resistant to all such cleaning agents, even after a thermal treatment.

SUMMARY OF THE INVENTION

An object of the present invention is to provide polymers and a method for their production. It is an additional object to provide a photosensitive mixture and a recording material comprising at least one 1,2-quinone diazide. It is a still further object to provide polymeric binders for a recording material with which planographic printing plates having higher print run performance and better cleaning agent resistance than known materials can be obtained. It is yet a further object to provide a photosensitive mixture based on 1,2-quinone diazides which essentially has the same processing properties as equivalent known mixtures.

In accordance with these objectives, there is provided a polymer comprising repeating units of the formula I

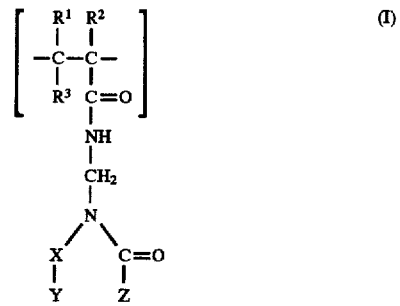

wherein $R^1$, $R^2$ and $R^3$ are, independently of one another, hydrogen atoms or alkyl groups, X is CO or $SO_2$, and Y and Z are, independently of one another, alkyl, alkenyl, cycloalkyl, aryl or heterocyclic radicals, or Y and Z are linked to one another and are constituents of a five-membered or six-membered heterocyclic ring.

In further accordance with these objectives, there is also provided a method for the production of a polymer which comprises reacting an unsaturated nitrile of formula

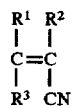

with an N-hydroxymethylimide of formula

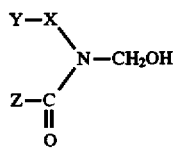

in the presence of an acid to form a monomer of the formula II

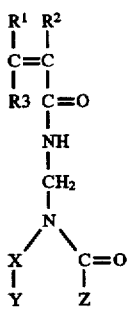

and polymerizing the monomer of Formula II in the presence of a free-radical-forming catalyst to form a polymer containing units of the formula I, and wherein

- $R^1$, $R^2$ and $R^3$ are, independently of one another, hydrogen atoms or alkyl groups,
- X is CO or $SO_2$, and
- Y and Z are, independently of one another, alkyl, alkenyl, cycloalkyl, aryl or heterocyclic radicals, or Y and Z are linked to one another and are constituents of a five-membered or six-membered heterocyclic ring.

In further accordance with these objectives, there is also provided a photosensitive mixture comprising a) a water-insoluble polymeric binder which is soluble or swellable in aqueous-alkaline solutions, and b) a 1,2-quinone diazide, wherein the water-insoluble binder a) is a polymer comprising repeating units of formula (I).

In still further accordance with these objectives, there is provided a photosensitive recording material having a photosensitive layer comprising the above photosensitive mixture.

DETAILED DESCRIPTION OF THE PREFERRED EMBODIMENTS

The monomers of the formula II on which the units of the formula I are based are readily accessible by the Ritter reaction [K. I. Krimen, J. Cota, Org. React. 17 (1969) 213], i.e. by an acid-catalyzed reaction of unsaturated nitriles with N-hydroxymethylimides in accordance with the following equation:

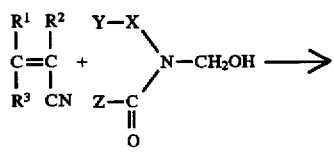

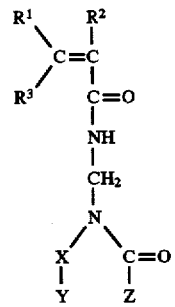

This synthesis is described in JACS 69(1947), 254, U.S. Pat. No. 2,529,455 and Bl. Chem. Soc. Jap. 61 (1988) 3755–3757, both of which are incorporated by reference in their entireties.

Since the formation of the N-hydroxymethylimides from formaldehyde and imide may also take place, in addition to the reaction with the nitrile, under acid-catalyzed conditions, both reaction stages can also be combined as a "single-pot process".

Examples of monomers of the formula II are the reaction products of acrylonitrile, methacrylonitrile or crotonitrile with the N-hydroxymethyl derivatives of succinimide, phenylsuccinimide, glutarimide, maleimide, dimethylmaleimide, phthalimide, naphthaline-1,8-dicarboximide (benzo[de]isoquinoline-1,3-dione), 2-sulfobenzoimide (benzo[d]isothiazole-1,1,3-trione), acesulfam (6-methyl-1,2,3-oxathiazine-2,2,4-trione), cyanuric acid (1,3,5-triazine-2,4,6-triole), uric acid (purine-2,6,8-triole), alloxan (pyrimidine-2,4,5,6-tetraone) or parabanic acid (imidazole-2,4,5-trione).

It is furthermore possible to perform the reaction on the polymer itself, that is, modifying a polymer containing free nitrile groups by reaction with N-hydroxymethylimides, as is described in Makromol. Chem. 182 (1981) 2989, which is incorporated by reference in its entirety.

It should be noted that with respect to Formula I, $R^1$, $R^2$, and $R^3$ may be either hydrogen or alkyl and X may be either CO or $SO_2$. However, if any of $R^1$, $R^2$ and $R^3$ are alkyl groups, they preferably contain in each case no more than 4 carbon atoms and are also preferably unbranched. In a preferred embodiment, $R^1$ and $R^3$ are hydrogen atoms. $R^2$ is preferably a hydrogen atom or a methyl group. Y and Z each independently from each other may comprise alkyl, alkenyl, cycloalkyl, aryl or heterocyclic radicals, or Y and Z may be linked to one another and may be constituents of a five-membered or six-membered heterocyclic ring. If either or both Y and Z comprise heterocyclic radicals, any such heterocyclic radicals may independently be either saturated or unsaturated. Y and Z preferably contain in each case no more than 20 carbon atoms. If Y and Z are linked to one another, they are preferably constituents of a five-membered ring to which a further ring, preferably a benzene ring, may be optionally fused. The heterocyclic radicals Y and Z are most preferably unsaturated heteroaryl radicals.

In addition to the units of the formula I, the polymers may contain further units, in particular those which have an acidic H atom. For example, units of sulfonic, carboxylic or phosphonic acids, sulfonamides, sulfonimides or carboximides, and units containing phenolic hydroxyl groups may optionally be included.

Units containing carboxylic or phenolic hydroxyl groups may be employed as optional corresponding monomers.

Examples of corresponding comonomers include, for example, o-, m- and p-hydroxyphenyl acrylate or methacrylate, o-, m- and p-hydroxyphenylacrylamide or -methacrylamide, o-, m- and p-hydroxystyrene, 4-hydroxy-3-methylstyrene, 4-hydroxy-3,5-dimethylbenzyl (meth) acrylate or 4-hydroxy-3,5-dimethylbenzyl (meth) acrylamide, acrylic acid, methacrylic acid, itaconic acid, crotonic acid and maleic acid.

The proportion of units of the formula I in the polymer is preferably 20 to 100% by weight, most preferably 40 to 95% by weight, in each case based on the total weight of the polymer. The proportion of comonomer units is preferably between 0 and 80% by weight, most preferably between 5 and 60% by weight, again based on the total weight of the polymer.

In addition to the units described, the polymers may furthermore contain optional units which serve to adjust or match the properties of the polymer to specific requirements. Examples of corresponding monomers are acrylates or methacrylates such as phenyl, benzyl, furfuryl or methyl (meth)acrylate, esters of acrylic and methacrylic acid containing amino/hydroxyl groups such as 2-dimethylaminoethyl or 2-hydroxyethyl (meth)acrylate, alkyl vinyl ethers or esters such as vinyl acetate or vinyl methyl ether, styrene or substituted styrenes such as α-methylstyrene or vinyltoluene, acrylonitrile or methacrylonitrile or acrylamide or methacrylamide, and furthermore vinyl amides such as N-vinylpyrrolidone and N-methyl-N-vinylacetamide.

Furthermore, it is possible to incorporate by polymerization, small optional amounts of bifunctional monomers such as N,N'-methylenebismethacrylamide or monomers which are capable of a thermal crosslinking reaction in the binders. Examples of such monomers are representatives containing lateral, activated —$CH_2OR$ groups such as are described in EP-A 0 184 044 and U.S. Pat. No. 4,699,867, both of which are incorporated by reference in their entireties, and monomers containing epoxy units such as glycidyl methacrylate or monomers containing lateral masked isocyanate units.

The polymerization of the monomers or their copolymerization with other monomers may be carried out by known methods, for example in the presence of a polymerization initiator such as azobisisobutyronitrile or dibenzoyl peroxide in organic solvents at elevated temperatures for preferably 1 to 20 hours. In addition, the polymerization may alternately be conducted by a suspension polymerization, emulsion polymerization, precipitation polymerization or bulk polymerization which may also be initiated by radiation, heat or ionic initiators.

The polymers according to the present invention are useful not only as binders in photosensitive mixtures. They can also be employed to produce thermally curable varnishes or coatings which are resistant to most chemicals.

According to the invention, a photosensitive mixture is furthermore provided which comprises
 a) a water-insoluble binder which is soluble or swellable in aqueous alkaline solutions, and
 b) a 1,2-quinone diazide.

The mixture according to the invention includes one in which the water-insoluble binder a) is a polymer of the composition of formula I as defined above. Preferably the binder is a composition of formula I.

The proportion of binder in the photosensitive mixture is preferably 10 to 95% by weight, most preferably 30 to 80% by weight, relative to the total weight of all the nonvolatile constituents of the mixture.

The 1,2-quinone diazides preferably comprise (1,2-naphthoquinone 2-diazide)-4- or -5-sulfonates or -sulfonamides. Of these, the esters are preferred. Suitable compounds of this type are known and are described, for example, in DE-C 938 233 and GB-B 739 654, both of which are incorporated by reference in their entireties.

The amount of o-quinone diazide compounds is preferably 3 to 50%, most preferably 7 to 35% by weight, relative to the nonvolatile proportions of the mixture.

It is also possible to react the 1,2-quinone diazide compounds in the form of their sulfonyl chlorides with the polymers according to the invention if the latter contain reactable hydroxyl or amino groups.

The esterification/amidation of the corresponding acid chlorides with the hydroxyl or amino groups of the polymers may be performed by known processes such as described in DE-A 25 07 548 and U.S. Pat. No. 4,139,384, both of which are incorporated by reference in their entireties.

Additionally, numerous other oligomers and polymers can optionally be used at the same time as the binder. For example, phenolic resins of the novolak type or vinyl polymers such as polyvinyl acetals, polymethacrylates, polyacrylates, polyvinyl ethers and polyvinylpyrrolidones, which may themselves be modified by comonomers may optionally be employed.

To produce an imagewise color contrast which is perceptible immediately after exposure to light, the mixtures may optionally contain a combination of indicator dyes and radiation-sensitive components which form strong acids on exposure to light, such as phosphonium, sulfonium and iodonium salts, halogen compounds and organometallic/organohalogen combinations.

The onium compounds mentioned, if employed, are most preferably used in the form of their salts which are soluble in organic solvents, generally as precipitation products with complex acids such as tetrafluoroboric acid, hexafluorophosphoric acid, hexafluoroantimonic acid and hexafluoroarsenic acid.

In principle, any organic halogen compound is suitable as a halogen-containing radiation-sensitive compound. These compounds are also known as photochemical free-radical starters, and include, for example, compounds containing at least one halogen atom on a carbon atom or on an aromatic ring and compounds which form hydrohalic acid, such as those disclosed in U.S. Pat. No. 3,515,552, which is incorporated by reference in its entirety. Of these compounds, s-triazine derivatives containing halomethyl groups, in particular trichloromethyl groups, and an aromatic or unsaturated substituent on the triazine nucleus, such as those described in DE-C-27 18 259 and U.S. Pat. No. 4,189,323, both of which are incorporated by reference in their entireties, are particularly preferred. Also suitable are 2-trihalomethyl-1,3,4-oxadiazoles. The action of these halogen-containing compounds can also be influenced spectrally and increased by known sensitizers.

Depending on its chemical nature and the composition of the layer, the amount of the optional photochemical acid donor may also be varied. Beneficial results are obtained by employing preferably about 0.1 to 10% by weight, relative to the total weight of the nonvolatile constituents.

Cationic dyes such as triphenylmethane dyes, in particular in the form of their carbinol bases, and methine dyes have proved particularly advantageous as indicator dyes.

Furthermore, soluble or finely divided dispersable dyes and UV absorbers, surfactants, polyglycol derivatives and pigments can also be added to the photosensitive mixture. The most beneficial quantitative ratios of the optional components can easily be determined by those skilled in the art in each individual case by preliminary experiments using the present specification as a guide.

In addition, according to the present invention, there is provided a further photosensitive recording material having a base layer and a photosensitive layer in which the photosensitive layer is composed of a mixture of the above composition.

To coat a suitable base layer, the photosensitive mixture is generally dissolved in a solvent. The choice of the solvent may be adjusted to the coating process, the layer thickness and the drying conditions. Strongly polar solvents are particularly suitable for inclusion in the photosensitive mixture according to the invention. These solvents include dimethyl sulfoxide, tetramethylene sulfone (sulfolane), N-methylpyrrolidone, N-hydroxyethylpyrrolidone, dimethylformamide, dimethylacetamide, butyrolactone, aceto- or butyronitrile, 2-nitropropane or nitromethane, ethylene or propylene carbonate. Preferably, these solvents are used as a mixture with ketones such as acetone or methyl ethyl ketone, chlorinated hydrocarbons such as trichloroethylene or 1,1,1-trichloroethane, alcohols such as methanol, ethanol or propanol, ethers such as tetrahydrofuran, alcohol ethers such as ethylene or propylene glycol monomethyl ether and esters such as methyl acetate or ethyl acetate, ethylene or propylene glycol methyl ether acetate. In principle, any solvent or solvent mixture can be used which does not react irreversibly with the layer components.

Those constituents which after drying form the photosensitive layer are defined as "non-volatile constituents".

If a layer thickness below approximately 10 mm is desired, metals may be used as a base layer. For offset printing plates, bright-rolled aluminum is particularly suitable. The bright-rolled aluminum may be mechanically and/or electrochemically grained and optionally anodized. It may additionally be pretreated chemically, for example with polymers or polycondensates which have units containing phosphonic, carboxylic or sulfonic acid groups. It may furthermore contain units composed of monomers containing basic units, for example amino groups, and furthermore with silicates, phosphates, fluorides or fluoro complexes. Combinations of such pretreatments are also possible.

The base layer may be coated in a known manner by spinning, spraying, immersion, rolling, by means of slot dyes, doctor blades or by caster application.

The conventional light sources such as X-ray lamps, xenon pulsed lamps, metal-halide-doped mercury-vapor high-pressure lamps and carbon-arc lamps can be used for the exposure light source.

In this description, exposure or irradiation is to be understood as meaning the action of actinic electromagnetic radiation in wavelength ranges below about 500 nm. In principle, all the radiation sources which emit in this wavelength range are suitable. Advantageously, laser irradiation units, in particular automatic processing systems which contain an argon-ion or krypton-ion laser, for example, as radiation source may be used.

The irradiation may furthermore be performed with electron beams. In this case, compounds which form acid and which are not photosensitive below about 500 nm, for example, halogenated aromatic compounds or halogenated polymeric hydrocarbons, may also be used as initiators of the solubilization reaction. X-rays may also be used for the image production.

The imagewise exposed or irradiated layer regions can be removed in a known manner with virtually the same developers as those known for commercially available naphthoquinone diazide printing plates. The copying behavior of the recording materials according to the invention may advantageously be adjusted to the known developers and programmed spray development units. The aqueous developer solutions may contain, for example, alkali-metal phosphates, alkali-metal silicates or alkali-metal hydroxides. Furthermore, the developer may optionally include wetting agents and/or small proportions of organic solvents. In certain cases, solvent/water mixtures may additionally be usable as developers. The choice of the most beneficial developer can be readily determined by experimentation, with the layer used in each case. This experiment is readily accomplished by those skilled in the art using the present specification as a guide. If necessary, the development can be aided mechanically.

Furthermore, after the imagewise exposure and development with an aqueous alkaline developer solution (optionally after coating with a hydrophilic protective film, a bake gumming), the recording material according to the invention may be heated to an elevated temperature in order to further consolidate the image screen or printing screen further. In this connection, the image-covered radiation-sensitive recording material may be heated preferably to a temperature in the range from 150° to 280° C. for preferably 0.5 to 60 min.

Examples of preferred embodiments are specified below. In the examples, parts by weight (pbw) and parts by volume (pbv) are related as g to ccm. Percentages and quantitative ratios are to be understood in units of weight unless otherwise specified.

Synthesis Example for Monomers Corresponding to Formula II 1.5 mol of imide and 1.5 mol of paraformaldehyde were reacted in 1 l of boiling glacial acetic acid in the course of 1.5 h to form N-hydroxymethylimide. After cooling to 25° C., 1.3 l of concentrated sulfuric acid were first added, then 1.5 mol of unsaturated nitrile. The reaction solution was stirred for 30 min at 80° C. and, after cooling to 25° C., added dropwise to 12 l of ice water, in which process the product precipitated. The crude product was washed consecutively with common-salt solution, sodium hydrogen carbonate solution and water, and then dried at 40° C. at 53 mbar in vacuo. Yields approximately 80 to 90%.

The following were obtained by this procedure:

Monomer 1: N-acryloylaminomethylphthalimide from phthalimide and acrylonitrile

Monomer 2: N-methacryloylaminomethylphthalimide from phthalimide and methacrylonitrile Monomer 3: N-acryloylaminomethylbenzo[d]isothiazole-1,1,3-trione from saccharin and acrylonitrile Monomer 4: N-methacryloylaminomethylbenzo[d]isothiazole-1,1,3-trione from saccharin and methacrylonitrile.

Synthesis Example for Polymers Containing Monomer Units Corresponding to Formula I The monomers were dissolved in one of the above-mentioned strongly polar solvents to form a solution having a solids content of 30% by weight. This was heated to 80° C. and 3 mol % of azobisisobutyronitrile (AIBN), relative to the total monomer mixture, were added under nitrogen in the course of 1 h. The solutions were kept at this temperature for a further approximately 7 h. Polymers resulted which had reduced specific viscosities of 0.1 to 0.3 dl/g [0.1%-strength in dimethylformamide (DMF)].

With the monomers according to Table 1, the polymers listed in Table 2 were obtained by this procedure.

TABLE 1

| Monomer No. | Chemical name |
| --- | --- |
| 1 | N-Acryloylaminomethylphthalimide |
| 2 | N-Methacryloylaminomethylphthalimide |
| 3 | N-Acryloylaminomethylbenzo[d]isothiazole-1,1,3-trione |
| 4 | N-Methacryloylaminomethylbenzo[d]iso-thiazole-1,1,3-trione |
| 5 | 2-Hydroxyphenyl methacrylate |
| 6 | N-(4-Hydroxyphenyl)methacrylamide |
| 7 | N-(4-Sulfamoylphenyl)methacrylamide |
| 8 | Acrylic acid |
| 9 | 4-Hydroxy-3,5-dimethylbenzylmethacryl-amide |
| 10 | 4-Hydroxystyrene |
| 11 | Methyl methacrylate |
| 12 | Styrene |
| 13 | Methacrylamide |

TABLE 2

| Polymer No. | Monomer A | Monomer B | Monomer C | Monomer D |
| --- | --- | --- | --- | --- |
| 1 | 1 (100) | | | |
| 2 | 2 (60) | 5 (40) | | |
| 3 | 1 (60) | 5 (40) | | |
| 4 | 1 (60) | 5 (25) | 9 (15) | |
| 5 | 1 (70) | 5 (30) | | |
| 6 | 1 (60) | 5 (30) | 8 (10) | |
| 7 | 2 (60) | 5 (30) | 8 (10) | |
| 8 | 3 (60) | 5 (30) | 8 (10) | |
| 9 | 4 (60) | 5 (30) | 8 (10) | |
| 10 | 2 (60) | 11 (30) | 8 (10) | |
| 11 | 2 (60) | 11 (20) | 12 (10) | 8 (10) |
| 12V | 5 (100) | | | |
| 13V | 6 (100) | | | |
| 14V | 7 (100) | | | |
| 15V | 9 (100) | | | |
| 16V | 10 (100) | | | |
| 17 | 2 (60) | 5 (20) | 8 (10) | 13 (10) |

V = comparison
Numbers in brackets = proportion of monomer in % by weight
Polymer 12V corresponds to the polymers described in JP-A 76/36 129
13V corresponds to JP-A 75/55 406
14V corresponds to EP-A 0 330 239
15V corresponds to DE-A 38 20 699
16V corresponds to DE-A 23 22 230

EXAMPLE 1

A 0.3 mm thick aluminum foil which had been electrolytically grained in hydrochloric acid (RZ value according to DIN 4768: 5.0 μm), intermediately pickled in sulfuric acid and anodized (oxide weight 3.5 g/m²) and hydrophilized with polyvinylphosphonic acid was spin-coated with the following solution:

6.0 pbw of a polymer in accordance with Table 2

2.2 pbw of the esterification product of 1.5 mol of (1,2-naphthoquinone 2-diazide)-5-sulfonyl chloride and 1 mol of 2,3,4-trihydroxybenzophenone 0.3 pbw of (1,2-naphthoquinone 2-diazide)-4-sulfonyl chloride 0.2 pbw of victoria pure blue (C.I. 44 045)

0.6 pbw of 1,1,1-tris(4-hydroxyphenyl)ethane 0.1 pbw of a silica gel having a mean particle size of 4 μm as filler 0.01 pbw of a dimethylsiloxane/ethylene oxide/propylene oxide copolymer to make 100 pbw a mixture of tetrahydrofuran and dimethyl sulfoxide (65:35)

and dried at 110° C. The layer weights (LW) in g/m² are specified in Table 3.

Processing of the Finished Printing Plates

The printing plates were exposed under a 5 kW metal-halide lamp at a distance of 110 cm through a standard positive test master with a continuous-tone step wedge and a halftone step wedge for 100 s and developed for 60 s in the following developer:

| Developer: | |
| --- | --- |
| 0.4 mol/l | $Na_2SiO_3$, |
| 1% | of sodium benzoate |
| 0.1% | of an ethylene oxide/propylene oxide copolymer having a molecular weight of 1,600 |
| remainder | water |

The photosensitivity (PS) was assessed on the basis of the first open step in the continuous-tone step wedge, and the reproduction or resolution (R) on the basis of the number of completely reproduced areas of the 60 cm screen of the test master (see Table 3).

Resistance to Washing-out Agents for UV-curable Printing Inks (UV)

The exposed and developed plate was exposed to a washing-out agent based on alcohol-glycol ether/glycol ester (UV washing agent W 936 supplied by Zeller & Gmelin) in a cuvette for 60 s and the image damage was then assessed visually:

+=no attack or slight attack

0=average attack

−=strong attack or complete layer removal

Thermal Crosslinking Behavior (TC)

After applying a commercially available burning-in gum (RC 514 supplied by Hoechst AG), the plates were baked at 250° C. for 8 min in a paint drying oven. The resistance of the baked plates to strongly polar solvents was tested with dimethylformamide:

+=slight or no attack

−=strong attack or complete layer removal

Print Runs (PR)

The print run of a series of these plates in a sheet-fed offset press was determined in the nonthermally-cured state. Table 3 shows the results (PR in 1,000).

TABLE 3

| Example | Polymer | LW | PS | R | UV | TC | PR |
| --- | --- | --- | --- | --- | --- | --- | --- |
| 1-1 | 1 | 1.1 | 3 | 1-12 | + | + | |
| 1-2 | 2 | 2.0 | 4 | 1-12 | + | + | |
| 1-3 | 3 | 2.0 | 4 | 1-12 | + | + | 180 |
| 1-4 | 4 | 2.0 | 4 | 1-12 | + | + | 180 |
| 1-5 | 5 | 2.0 | 4 | 1-12 | + | + | |
| 1-6 | 6 | 1.8 | 4 | 1-12 | + | + | |
| 1-7 | 7 | 1.8 | 4 | 1-12 | + | + | 170 |
| 1-8 | 8 | 1.8 | 4 | 1-12 | + | + | |
| 1-9 | 9 | 1.8 | 4 | 1-12 | + | + | |
| 1-10 | 10 | 1.8 | 4 | 1-12 | + | + | |
| 1-11 | 11 | 1.8 | 4 | 1-12 | + | + | |
| 1-12V | 12 | 2.1 | 4 | 1-12 | − | − | 170 |
| 1-13V | 13 | 2.1 | 4 | 1-12 | 0 | − | 170 |
| 1-14V | 14 | 1.8 | 4 | 1-12 | + | − | 180 |
| 1-15V | 15 | 2.1 | 4 | 1-12 | 0 | + | 180 |
| 1-16V | 16 | 2.1 | 5 | 1-12 | − | − | |

TABLE 3-continued

| Example | Polymer | LW | PS | R | UV | TC | PR |
|---|---|---|---|---|---|---|---|
| 1-17V | PF resin* | 2.2 | 5 | 1-12 | – | + | 100 |
| 1-18 | 17 | 1.8 | 4 | 1-12 | + | + | 170 |

*= cresol/formaldehyde novolak having the hydroxyl number 420 according to DIN 53783/3240 and a mean molecular weight $M_w$ of 6,000, as determined by gel permeation chromatography (GPC) against a polystyrene standard.

The results show that printing plates produced with polymers according to the invention yield a higher print run than conventional positive printing plates with novolaks as binders. They are resistant to washing-out agents and they also become resistant to strongly polar solvents as a result of thermal postcuring.

EXAMPLE 2

A 0.28 mm thick aluminum foil which had been electrolytically grained in nitric acid (RZ value according to DIN 4768: 4.5 μm), intermediately pickled in sulfuric acid and anodized (oxide weight 3.0 g/m²), and hydrophilized with N-phosphonomethylpolyethylenimine and with polyvinylphosphonic acid according to the earlier German Patent Application P 44 23 140.7 was spin-coated with the following solution:

7.0 pbw of a polymer in accordance with Table 4

1.8 pbw of an esterification product of 3.4 mol of (1,2-naphthoquinone 2-diazide)-4-sulfonyl chloride and 1 mol of bis-(2,3,4-trihydroxy-5-benzoylphenyl)methane 0.2 pbw of 2-(4-styrylphenyl)-4,6-bistrichloromethyl-s-triazine, 0.18 pbw of Victoria pure blue 0.7 pbw of bis(4-hydroxyphenyl) sulfone 0.1 pbw of the silica gel of Example 1, 0.01 pbw of a dimethylsiloxane/ethylene oxide/propylene oxide copolymer to make 100 pbw a mixture of tetrahydrofuran and butyrolactone (65:35)

and dried at 110° C. Layer weights: uniformly 1.7 g/m².

Processing of the Finished Printing Plates

The printing plates were exposed under a 5 kW metal-halide lamp at a distance of 110 cm through a standard negative test master with continuous-tone and halftone elements as specified in Example 1 for 50 s, heat treated for 1.5 min at 135° C., burned out, after cooling in a water bath, over the entire surface without a master using a UV-A phosphorescent lamp and developed for 60 s in the following developer:

| | Developer: |
|---|---|
| 0.45 mol/l | $K_2SiO_3$ |
| 1% | of sodium cumenesulfonate |
| 0.1% | of polyglycol 1000 dicarboxylic acid |
| 0.01% | of sodium propylenediamine-tetraacetate |
| remainder | water |

Testing and Evaluation of the Plates Processed by the Reversal Process

The photosensitivity and the reproduction, the washing-out resistance, the postcuring behavior and the print run were assessed as in Example 1.

Table 4 shows the results.

TABLE 4

| Example | Polymer | PS | R | UV | TC | PR |
|---|---|---|---|---|---|---|
| 2-1 | 2 | 3 | 1-12 | + | + | |
| 2-2 | 3 | 3 | 1-12 | + | + | |
| 2-3 | 4 | 3 | 1-12 | + | + | 140 |
| 2-4 | 12V | 3 | 1-12 | – | + | 140 |
| 2-5 | 16V | 3 | 1-12 | – | + | |
| 2-6 | PF resin | 3 | 1-12 | – | + | 80 |

EXAMPLE 3

A 0.4 mm thick aluminum foil which had initially been grained mechanically and then electrolytically in hydrochloric acid (RZ value according to DIN 4768: 6.0 μm), intermediately pickled in sulfuric acid and anodized (oxide weight 4.0 g/m²) and hydrophilized with polyvinylphosphonic acid was spin-coated with the following solution:

6.5 pbw of a polymer in accordance with Table 5

2.3 pbw of the esterification product of 3.6 mol of (1,2-naphthoquinone 2-diazide)-5-sulfonyl chloride and 1 mol of bis(5-acetyl-2,3,4-trihydroxyphenyl)methane 0.4 pbw of (1,2-naphthoquinone 2-diazide)-4-sulfonyl chloride 0.5 pbw of 2,4-dihydroxybenzophenone 0.09 pbw of cristal violet base (C.I. 42 555:1)

to make 100 pbw a mixture of acetone and dimethyl acetamide (70:30), and dried at 110° C. The layer weights are specified in Table 5.

An anionically stabilized dispersion of a methacrylic acid/methyl methacrylate/ethyl acrylate copolymer having a methacrylic acid content of 6.1% by weight was then electrostatically sprayed onto these photosensitive layers in accordance with the earlier German Patent Application P 43 35 425.4 as matting layer so as to result in a mean bump height of 4 μm, a mean bump diameter of 30 μm and a bump density of approximately 2000/cm².

The plates were exposed and developed as in Example 1.

| | Developer: |
|---|---|
| 0.12 mol/l | $Na_2Si_3O_7$ |
| 0.48 mol/l | of KOH |
| 0.5% | of sodium pelargonate |
| 0.1% | nonylphenol polyethylene glycol ether containing 10 ethylene oxide units |
| 0.01% | of silicone defoamer (EC31 supplied by Hoechst AG) |
| remainder | water |

TABLE 5

| Example | Polymer | LW | PS | R | UV | TC | PR |
|---|---|---|---|---|---|---|---|
| 3-1 | 1 | 1.2 | 3 | 1-12 | + | + | |
| 3-2 | 2 | 2.0 | 4 | 1-12 | + | + | |
| 3-3 | 3 | 2.0 | 4 | 1-12 | + | + | >200 |
| 3-4 | 4 | 2.0 | 4 | 1-12 | + | + | >200 |
| 3-5 | 5 | 2.0 | 4 | 1-12 | + | + | |
| 3-6 | 6 | 1.8 | 4 | 1-12 | + | + | |
| 3-7 | 7 | 1.8 | 4 | 1-12 | + | + | >200 |

TABLE 5-continued

| Example | Polymer | LW | PS | R | UV | TC | PR |
|---|---|---|---|---|---|---|---|
| 3-8 | 8 | 1.8 | 4 | 1-12 | + | + | |
| 3-9 | 9 | 1.8 | 4 | 1-12 | + | + | |
| 3-10 | 10 | 1.8 | 4 | 1-12 | + | + | |
| 3-11 | 11 | 1.8 | 4 | 1-12 | + | + | |
| 3-12V | 12 | 2.1 | 4 | 1-12 | – | – | >200 |
| 3-13V | 13 | 2.1 | 4 | 1-12 | 0 | – | >200 |
| 3-14V | 14 | 1.8 | 4 | 1-12 | – | – | >200 |
| 3-15V | 15 | 2.1 | 4 | 1-12 | 0 | + | >200 |
| 3-16V | 16 | 2.1 | 5 | 1-12 | – | – | |
| 3-17V | PF resin | 2.2 | 5 | 1-12 | – | + | 160 |
| 3-18 | 17 | 1.8 | 4 | 1-12 | + | + | >200 |

Other embodiments of the invention will be apparent to those skilled in the art from consideration of the specification and practice of the invention disclosed herein. It is intended that the specification be considered as exemplary only, with the true scope and spirit of the invention being indicated by the following claims.

What is claimed is:

1. A polymer comprising:

repeating units of formula I:

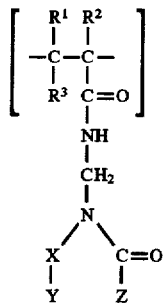

wherein
$R^1$, $R^2$ and $R^3$ are, independently of one another, hydrogen atoms or alkyl groups,
X is CO or $SO_2$, and
Y and Z are, independently of one another, alkyl, alkenyl, cycloalkyl, aryl, or heterocyclic radicals, or Y and Z are linked to one another and are constituents of a five-membered or six-membered heterocyclic ring; and units containing acidic hydrogen atoms which are derived from sulfonic, carboxylic or phosphonic acids, sulfonamides, sulfonimides or carboximides or phenols.

2. A polymer has claimed in claim 1, wherein $R^1$ and $R^3$ are hydrogen atoms.

3. A polymer as claimed in claim 1, wherein $R^2$ is a methyl group.

4. A polymer as claimed in claim 1, wherein Y and Z are linked to form a five-membered ring to which a further ring is fused.

5. A polymer as claimed in claim 4, wherein the further ring is a benzene ring.

6. A polymer as claimed in claim 1, wherein said units of the formula I are present in an amount from 20–100% by weight based on the weight of the polymer.

7. A method for the production of a polymer comprising: repeating units of formula I:

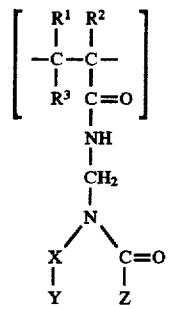

wherein
$R^1$, $R^2$ and $R^3$ are, independently of one another, hydrogen atoms or alkyl groups,
X is CO or $SO_2$, and
Y and Z are, independently of one another, alkyl, alkenyl, cycloalkyl, aryl, or heterocyclic radicals, or Y and Z are linked to one another and are constituents of a five-membered or six-membered heterocyclic ring; and units containing acidic hydrogen atoms which are derived from sulfonic, carboxylic or phosphonic acids, sulfonamides, sulfonimides or carboximides or phenols, said method comprising reacting an unsaturated nitrile of formula:

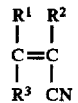

with an N-hydroxymethylimide of formula:

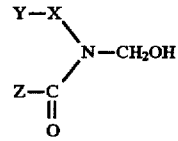

in the presence of an acid to form a monomer of formula II

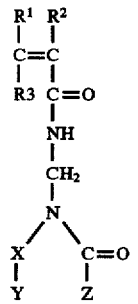

and copolymerizing the monomer of the formula II and said units containing acidic hydrogen atoms in the presence of a free-radical-forming catalyst to form the polymer containing units of the formula I, and wherein $R^1$, $R^2$ and $R^3$ are, independently of one another, hydrogen atoms or alkyl groups,
X is CO or $SO_2$, and Y and Z are, independently of one another, alkyl, alkenyl, cycloalkyl, aryl, or heterocyclic radicals, or Y and Z are linked to one another and are constituents of a five-membered or six-membered heterocyclic ring.

8. A method for the production of a polymer as claimed in claim 7, wherein $R^1$ and $R^3$ are hydrogen atoms.

9. A method for the production of a polymer as claimed in claim 7, wherein $R^2$ is a methyl group.

10. A method for the production of a polymer as claimed in claim 7, wherein Y and Z are linked to form a five-membered ring to which a further ring is fused.

11. A method for the production of a polymer as claimed in claim 10, wherein the further ring is a benzene ring.

12. A method for the production of a polymer as claimed in claim 7, further comprising reacting monomer units containing acidic hydrogen atoms.

13. A method for the production of a polymer as claimed in claim 12, wherein the units containing acidic hydrogen atoms are derived from sulfonic, carboxylic or phosphonic acids, sulfonamides, sulfonimides or carboximides or phenols.

14. A method for the production of a polymer as claimed in claim 7, wherein said monomer units of the formula II are present in an amount from 20–100% by weight based on the weight of the polymer.

15. A method for producing a photosensitive mixture comprising mixing (a) a water-insoluble polymeric binder which is soluble or swellable in aqueous-alkaline solutions and (b) a 1,2 quinone diazide, wherein the water-insoluble binder a) comprises a polymer comprising:

repeating units of formula I:

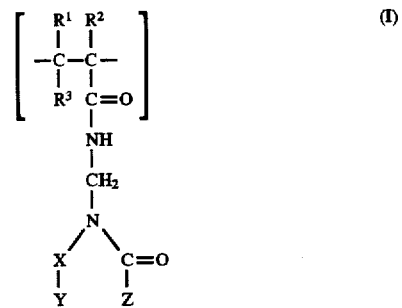

wherein $R^1$, $R^2$ and $R^3$ are independently of one another, hydrogen atoms or alkyl groups, X is CO or $SO_2$, and Y and Z are independently of one another, alkyl, alkenyl, cycloalkyl, aryl, or heterocyclic radicals, or Y and Z are linked to one another and are constituents of a five-membered or six-membered heterocyclic ring; and units containing acidic hydrogen atoms which are derived from sulfonic, carboxylic or phosphonic acids, sulfonamides, sulfonimides or carboximides or phenols.

16. A method for producing a photosensitive recording material comprising forming a base layer and a photosensitive layer, wherein the photosensitive layer comprises a photosensitive mixture as claimed in claim 15.

* * * * *